(12) United States Patent
Li

(10) Patent No.: US 10,564,875 B2
(45) Date of Patent: Feb. 18, 2020

(54) OPTICAL DECODING SYSTEM APPLIED TO MODE CONVERSION OF A MEMORY

(71) Applicant: PixArt Imaging Inc., Hsin-Chu (TW)

(72) Inventor: Jr-Yi Li, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 109 days.

(21) Appl. No.: 15/867,647

(22) Filed: Jan. 10, 2018

(65) Prior Publication Data

US 2019/0212933 A1    Jul. 11, 2019

(51) Int. Cl.
*G06F 3/06* (2006.01)

(52) U.S. Cl.
CPC .......... *G06F 3/0634* (2013.01); *G06F 3/0604* (2013.01); *G06F 3/0679* (2013.01)

(58) Field of Classification Search
CPC ..... G06F 3/0604; G06F 3/0634; G06F 3/0679
See application file for complete search history.

(56) References Cited

U.S. PATENT DOCUMENTS

| 5,177,745 A | * | 1/1993 | Rozman | G01R 31/31701 365/201 |
| 5,553,025 A | * | 9/1996 | Haraguchi | G11C 29/46 365/189.03 |
| 2014/0164680 A1 | * | 6/2014 | Lai | G06F 3/0679 711/103 |

* cited by examiner

*Primary Examiner* — Aracelis Ruiz
(74) *Attorney, Agent, or Firm* — Winston Hsu

(57) ABSTRACT

An optical decoding system is applied to mode conversion of a memory. The optical decoding system includes an optical sensor and a processor. The optical sensor is utilized to sense an intensity of a pattern, and variation of the intensity containing an activation code. The processor is electrically connected with the optical sensor. The processor is adapted to analyze the variation of the intensity and to switch the memory from a normal mode to a configuration mode in accordance with the activation code. Normal operation of the memory is paused while the memory is set in the configuration mode.

11 Claims, 5 Drawing Sheets

First threshold range : 90%~100%
Second threshold range : 0%~10%

First threshold range : 90%~100%
Second threshold range : 0%~10%
Third threshold range : 40%~60%

OPTICAL DECODING SYSTEM APPLIED TO MODE CONVERSION OF A MEMORY

BACKGROUND OF THE INVENTION

1. Field of the Invention

The present invention relates to an optical decoding system, and more particularly, to an optical decoding system applied to mode conversion of a memory.

2. Description of the Prior Art

A read-only memory (ROM) is a type of non-volatile memory used in computers and any electronic device, a datum stored into the read-only memory cannot be modified and deleted and is not removed while the computer and the electronic device are shut down, and is mainly utilized to store firmware or application software. The read-only memory is kept in a normal mode as the read-only memory has a fault detected by booting up the computer, the read-only memory cannot be switched to a configuration mode or a setting mode, so the fault cannot be repaired and the read-only memory has to be abandoned. Although the fault of the read-only memory may be repaired by laser cutting, operation of the laser cutting is complicated and expensive, so that design of a method capable of repairing the read-only memory without physical destruction is an important issue in the related industry.

SUMMARY OF THE INVENTION

The present invention provides an optical decoding system applied to mode conversion of a memory for solving above drawbacks.

According to the claimed invention, an optical decoding system applied to mode conversion of a memory is disclosed. The optical decoding system includes an optical sensor and a processor. The optical sensor is utilized to sense an intensity of a pattern, and variation of the intensity containing an activation code. The processor is electrically connected with the optical sensor. The processor is adapted to analyze the variation of the intensity and to switch the memory from a normal mode to a configuration mode in accordance with the activation code. Normal operation of the memory is paused while the memory is set in the configuration mode.

According to the claimed invention, the activation code is consisted of a first status and a second status, the processor determines the intensity varied from a first threshold range to a second threshold range as the first status, and further determines the intensity varied from the second threshold range to the first threshold range as the second status. The processor determines the intensity varied from the first threshold range to a third threshold range through the second threshold range as the first status, and further determines the intensity varied from the third threshold range to the first threshold range through the second threshold range as the second status.

According to the claimed invention, the activation code is consisted of a first status and a second status, the processor determines a first frequency of the intensity varied between separate threshold ranges as the first status, and further determines a second frequency of the intensity varied between separate threshold ranges as the second status. The activation code is consisted of a first status and a second status, the processor determines a first period of the intensity modulated within a specific threshold range as the first status, and further determines a second period of the intensity modulated within the specific threshold range as the second status. The activation code is terminated while the intensity is not varied over a predefined period or the intensity is varied with a predefined property.

The optical decoding system of the present invention can be built in the memory, and the memory is automatically switched to the configuration mode to pause the normal operation or the memory is passively updated firmware while the specific intensity variation of the pattern is detected by the optical decoding system. The activation code can be represented as the switching code, the programming code or the identification code, and the configuration mode can be represented as a recovery mode, an engineering mode, a safety mode, a detection mode, or an automatic updating mode. Comparing to the prior art, the optical decoding system of the present invention can over the read-only feature of the ROM for easy mode switching, firmware updating and data transmission.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
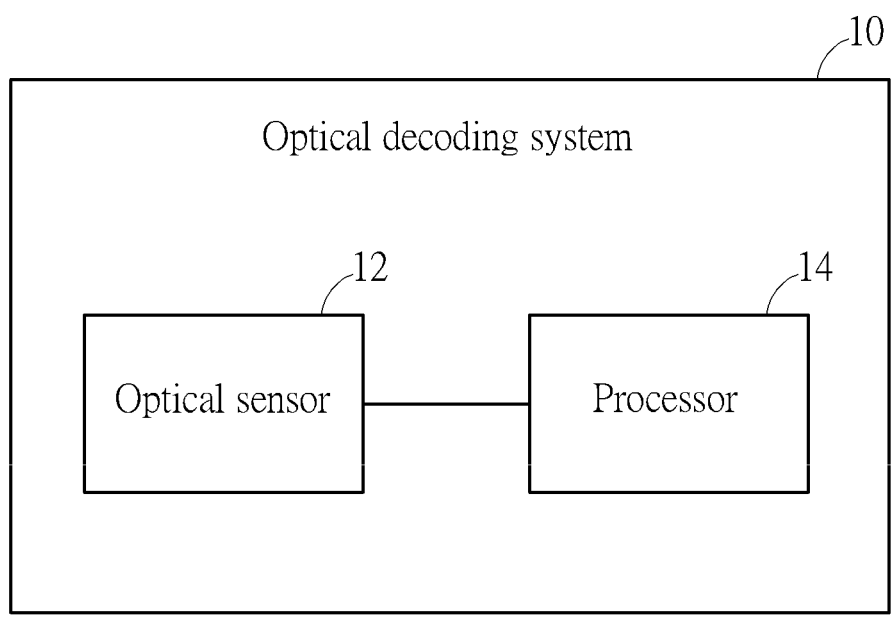
FIG. 1 is a block diagram of an optical decoding system according to a first embodiment of the present invention.

Please refer to FIG. 1. FIG. 1 is a block diagram of an optical decoding system 10 according to a first embodiment of the present invention. The optical decoding system 10 includes an optical sensor 12 and a processor 14 electrically connected with each other. The optical sensor 12 is utilized to sense an intensity of a pattern, and variation of the intensity can contain an activation code. The processor 14 is adapted to analyze the variation of the intensity and to accordingly switch modes of the memory in accordance with the activation code. The optical decoding system 10 can be built in a memory, the memory can be a read-only memory (ROM), the optical decoding system 10 is used to switch the memory from a normal mode to a configuration mode while the ROM code has a fault, and normal operation of the memory in the configuration mode is paused for testing, updating or data migration.

Figure 2:
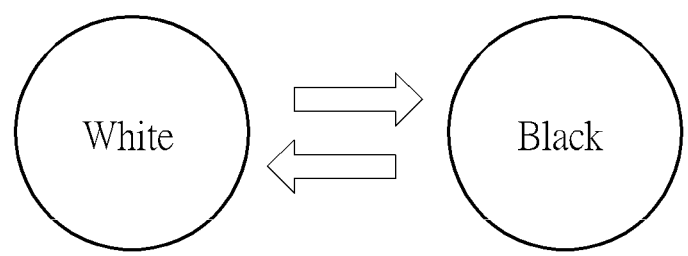
FIG. 2 and FIG. 3 are diagrams of the activation code according to different embodiments of the present invention.
Figure 3:
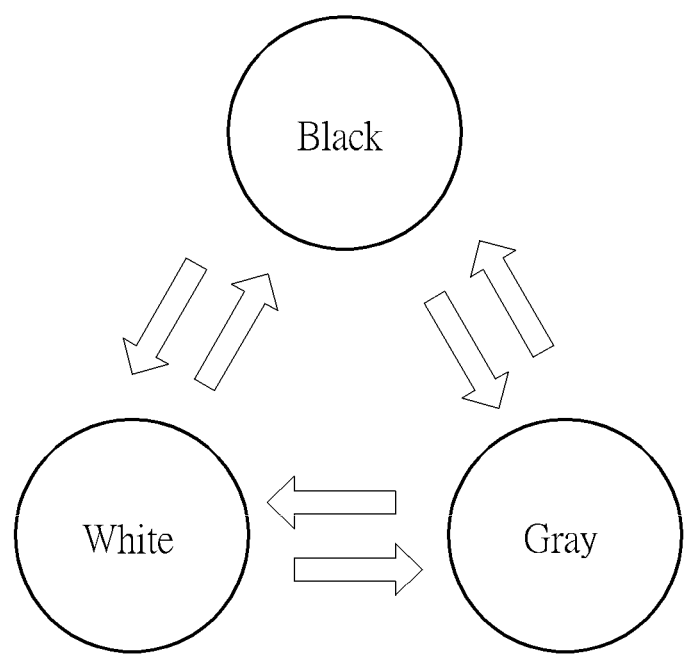

The pattern can be generated by an external lighting unit. The lighting unit changes the intensity of the pattern to compile the activation code. Please refer to FIG. 2 and FIG. 3. FIG. 2 and FIG. 3 are diagrams of the activation code according to different embodiments of the present invention. As an example shown in FIG. 2, the activation code is consisted of a first status (which can be called bit 0) and a second status (which can be called bit 1), a first threshold range may be set as 90%~100%, and a second threshold range may be set as 0%~10%. The processor 14 receives the intensity from the optical sensor 12 and determines the intensity varied from the first threshold range to the second threshold range as the first status, and further determines the intensity varied from the second threshold range to the first threshold range as the second status. The intensity which is not varied between the first threshold range and the second threshold range cannot be defined as the activation code.

Therefore, the optical decoding system 10 can acquire the activation code by scintillation of the lighting unit. The pattern is changed from white (such like the first threshold range set as 90%~100%) to black (such like the second threshold range set as 0%~10%), the activation code is analyzed to have the bit 0; the pattern is changed from black to white, the activation code is analyzed to have the bit 1. The intensity variation of the pattern can contain the activation code consisted of the bit 0 and the bit 1, so that the continuous intensity variation of the pattern can arrange a series of bits and bytes to establish application program, and the application program can be written into the memory via the optical decoding system 10. Values of the first threshold range and the second threshold range are adjustable, which means color variation of the pattern can be adjusted according to design demand.

As an example shown in FIG. 3, the first threshold range may be set as 90%~100%, the second threshold range may be set as 0%~10%, and a third threshold range may be set as 40%~60%. The processor 14 can determines the intensity varied from the first threshold range to the third threshold range through the second threshold range as the first status, and further determines the intensity varied from the third threshold range to the first threshold range through the second threshold range as the second status. In this embodiment, the pattern is changed from white to black and then to gray (such like the third threshold range set as 40%~60%), the activation code is analyzed to have the bit 0; the pattern is changed from grey to black and then to white, the activation code is analyzed to have the bit 1. The color variation of the pattern is multilevel than the embodiment shown in FIG. 2, and can be used to avoid modes of the memory from switching by unexpected noise.

In addition, the processor 14 further can analyze a frequency of the intensity varied between separate threshold ranges to determine the activation code. For example, a first frequency may be set as 30 hertz, a second frequency may be set as 60 hertz, the processor 14 can determine the first frequency of the intensity varied between separate threshold ranges (such as the first threshold range and the second threshold range) as the first status, and further determine the second frequency of the intensity varied between the said separate threshold ranges as the second status; thus, the lighting unit provides low speed scintillation to output the bit 0, and provides high speed scintillation to output the bit 1. Serial scintillation of the lighting unit can form the completed activation code.

In another possible embodiment, a modulated period of the intensity within a specific threshold range can be utilized to output the bit 0 or the bit 1. For instance, a first period can be set as 5 millisecond and a second period can be set as 10 millisecond, the processor 14 can determine the first period of the intensity modulated within a specific threshold range as the first status, and further determine the second period of the intensity modulated within the specific threshold range as the second status. Besides, the activation code can be terminated while the intensity is not varied over a predefined period (such as 15 millisecond) or the intensity is varied with a predefined property (such as the pattern changed from grey to black and then to white through grey). Values and amounts of threshold range, the varied frequency, the modulated period, the predefined period and the predefined property are not limited to the above-mentioned embodiments, which depends on actual demand.

The optical decoding system 10 is preferably used in the read-only memory. Due to read-only feature of the memory, the activation code can be a switching code, the optical decoding system 10 can read and decode the switching code to automatically switch the read-only memory from the normal mode to the configuration mode, so as to pause the normal operation of the memory for repair; further, the activation code can be a programming code, the optical decoding system 10 can read and decode the programming code to write the application program into the memory, which means the optical decoding system 10 can be a kind of communication interface. Regarding to protocol stack of this embodiment, the PHY layer receives the activation code consisted of the bit 0 and the bit 1, the MAC layer decodes the activation code, and the APP layer executes a related program in accordance with the decoded the activation code.

Figure 4:
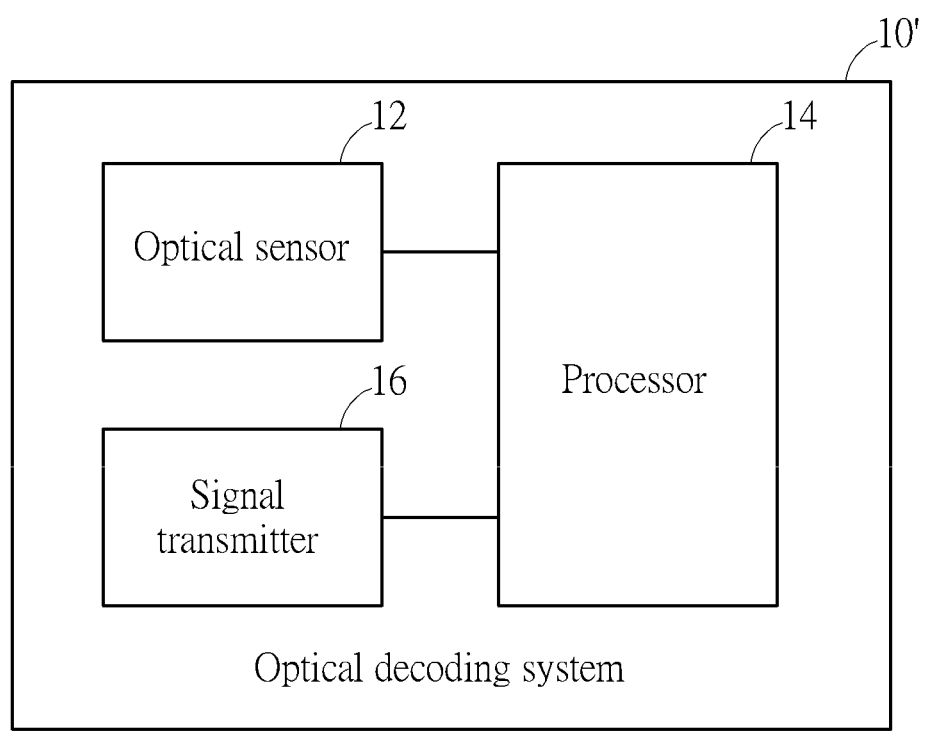
FIG. 4 is a block diagram of an optical decoding system according to a second embodiment of the present invention.

Please refer to FIG. 4. FIG. 4 is a block diagram of an optical decoding system 10' according to a second embodiment of the present invention. The optical decoding system 10' includes the optical sensor 12, the processor 14 and a signal transmitter 16, and the processor 14 is electrically connected with the optical sensor 12 and the signal transmitter 16. In the second embodiment, elements having the same numerals as ones of the first embodiment have the same functions, and a detailed description is herein for simplicity. While the processor 14 analyzes the activation code in accordance with a detection result of the optical sensor 12, the processor 14 can generate a message related to the activation code and drive the signal transmitter 16 to output the message accordingly; the memory can be switched to the configuration mode for preparation of message communication.

Generally, the optical decoding system 10' can be installed inside a navigation device, such as the wireless mouse or the wireless keyboard, two navigation devices can communicate with each other by its own optical decoding system 10'. For example, the first wireless navigation device is matched with a dongle via a specific identification code; if the second wireless navigation device is used to replace the first wireless navigation device, the first wireless navigation device having the optical decoding system 10' can output the message containing information of the specific identification code, and the second wireless navigation device having the optical decoding system 10' can receive and decode the message to be rapidly and automatically matched with the dongle. The message not only contains the identification code, but also contains operation parameters of the wireless navigation device. An extra dongle particularly for the second wireless navigation device is unnecessary.

Figure 5:
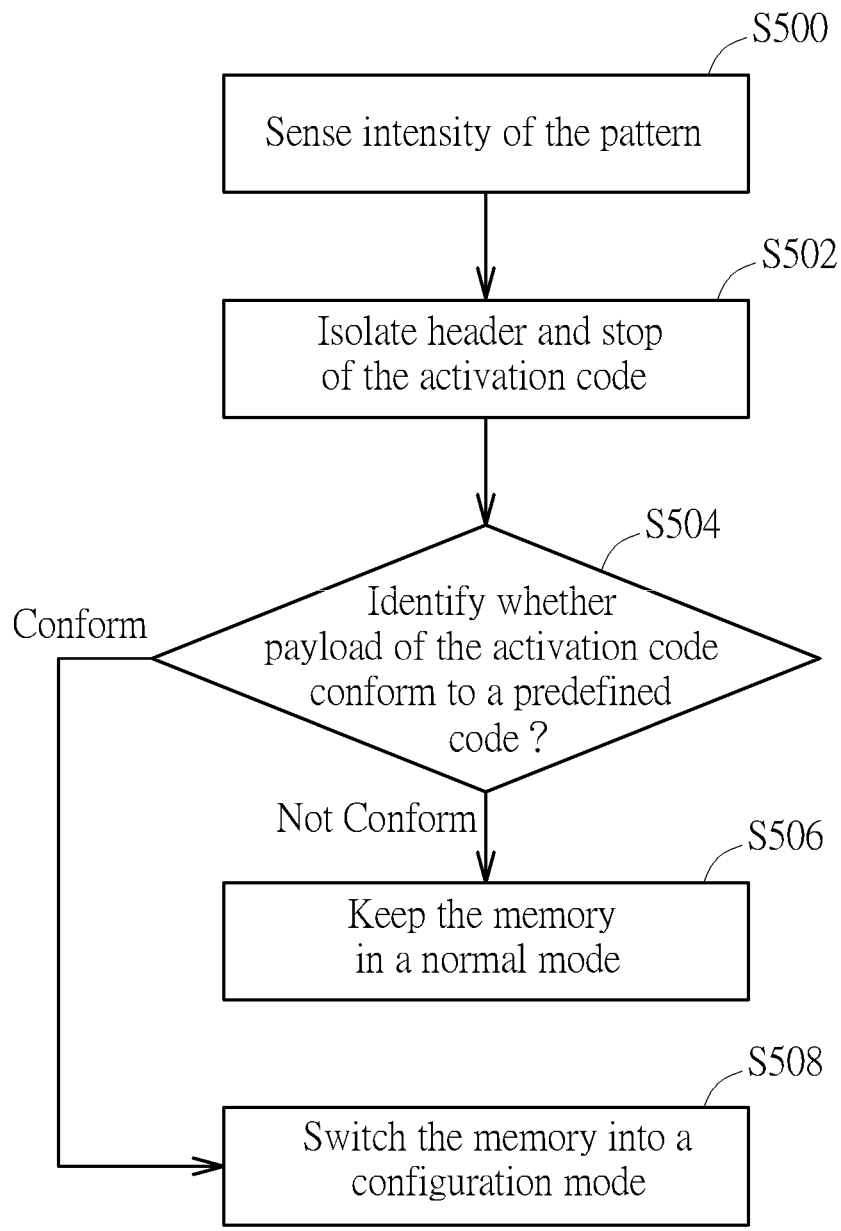
FIG. 5 is a flow chart of a method of switching modes of the memory according to the embodiment of the present invention.

The activation code can include header, payload and stop. The header and the stop can be designed by specific arrangement of the bit 0 and 1, and the payload contains a command of mode conversion or the identification code or updated/migrated data (such as the operation parameters). Please refer to FIG. 5. FIG. 5 is a flowchart of a method of switching modes of the memory according to the embodiment of the present invention. The method illustrated in FIG. 5 is suitable for the optical decoding system shown in FIG. 1 and FIG. 4. First, step S500 is executed to drive the optical sensor 12 to sense the intensity of the pattern. Then, steps S502 and S504 are executed to isolate the header and the stop of the activation code, and to identify the payload of the activation code. As the activation code does not conform to a predefined code, the intensity variation of the pattern is noise, step S506 is executed that the memory is kept in the normal mode with normal operation. As the activation code conforms to the predefined code, step S508 is executed that the memory is switched into the configuration mode to pause the normal operation for testing, updating or data migration.

In conclusion, the optical decoding system of the present invention can be built in the memory, and the memory is automatically switched to the configuration mode to pause the normal operation or the memory is passively updated firmware while the specific intensity variation of the pattern is detected by the optical decoding system. The activation code can be represented as the switching code, the programming code or the identification code, and the configuration mode can be represented as a recovery mode, an engineering mode, a safety mode, a detection mode, or an automatic updating mode. Comparing to the prior art, the optical decoding system of the present invention can over the read-only feature of the ROM for easy mode switching, firmware updating and data transmission.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical decoding system applied to mode conversion of a memory, the optical decoding system comprising:
    an optical sensor utilized to sense an intensity of a pattern, variation of the intensity containing an activation code; and
    a processor electrically connected with the optical sensor, the processor being adapted to analyze the variation of the intensity and to switch the memory from a normal mode to a configuration mode in accordance with the activation code.

2. The optical decoding system of claim 1, wherein normal operation of the memory is paused while the memory is set in the configuration mode.

3. The optical decoding system of claim 1, wherein the activation code consists of a first status and a second status, the processor determines the intensity varied from a first threshold range to a second threshold range as the first status, and further determines the intensity varied from the second threshold range to the first threshold range as the second status.

4. The optical decoding system of claim 3, wherein the processor determines the intensity varied from the first threshold range to a third threshold range through the second threshold range as the first status, and further determines the intensity varied from the third threshold range to the first threshold range through the second threshold range as the second status.

5. The optical decoding system of claim 1, wherein the activation code consists of a first status and a second status, the processor determines a first frequency of the intensity varied between separate threshold ranges as the first status, and further determines a second frequency of the intensity varied between separate threshold ranges as the second status.

6. The optical decoding system of claim 1, wherein the activation code consists of a first status and a second status, the processor determines a first period of the intensity modulated within a specific threshold range as the first status, and further determines a second period of the intensity modulated within the specific threshold range as the second status.

7. The optical decoding system of claim 1, wherein the activation code is terminated while the intensity is not varied over a predefined period or the intensity is varied with a predefined property.

8. The optical decoding system of claim 1, further comprising:
    a signal transmitter electrically connected with the processor and adapted to output a message driven by the processor.

9. The optical decoding system of claim 8, wherein the optical decoding system is installed inside a navigation device, the message comprises information of the configuration mode about the navigation device, and the information is received by another navigation device.

10. The optical decoding system of claim 1, wherein the memory is a read-only memory.

11. The optical decoding system of claim 1, wherein the processor switches the memory to the configuration mode for testing, updating or data migration.

* * * * *